(12) United States Patent
Lin

(10) Patent No.: US 8,981,631 B2
(45) Date of Patent: Mar. 17, 2015

(54) ILLUMINATION APPARATUS

(71) Applicant: Lextar Electronics Corporation, Hsinchu (TW)

(72) Inventor: Sheng-Wang Lin, Taipei (TW)

(73) Assignee: Lextar Electronics Corporation, Hsinchu (TW)

(*) Notice: Subject to any disclaimer, the term of this patent is extended or adjusted under 35 U.S.C. 154(b) by 0 days.

(21) Appl. No.: 14/022,359

(22) Filed: Sep. 10, 2013

(65) Prior Publication Data
US 2014/0117832 A1 May 1, 2014

(30) Foreign Application Priority Data
Oct. 31, 2012 (TW) .............................. 101140361 A

(51) Int. Cl.
| | |
|---|---|
| H01J 5/16 | (2006.01) |
| H01J 61/40 | (2006.01) |
| H01K 1/26 | (2006.01) |
| H01K 1/30 | (2006.01) |
| F21V 8/00 | (2006.01) |
| H05K 3/00 | (2006.01) |
| H05K 1/18 | (2006.01) |

(52) U.S. Cl.
CPC .............. G02B 6/003 (2013.01); H05K 3/0058 (2013.01); *G02B 6/0086* (2013.01); *H05K 1/181* (2013.01); *H05K 2201/10106* (2013.01); *H05K 2201/10121* (2013.01); *H05K 2201/10598* (2013.01)
USPC .......................................... 313/110; 362/455

(58) Field of Classification Search
CPC ...... G09F 13/00; G02B 6/003; G02B 6/0086; H05K 1/00

USPC ............. 313/110, 498, 112; 257/98; 362/277, 362/471, 455, 433
See application file for complete search history.

(56) References Cited

U.S. PATENT DOCUMENTS

| | | | | |
|---|---|---|---|---|
| 7,226,185 | B2 * | 6/2007 | Dolgin et al. .................. | 362/239 |
| 7,281,818 | B2 * | 10/2007 | You et al. ...................... | 362/241 |
| 7,631,986 | B2 * | 12/2009 | Harrah .......................... | 362/230 |
| 7,723,741 | B2 * | 5/2010 | Farnworth et al. ............... | 257/98 |
| 8,066,406 | B2 * | 11/2011 | Boyer et al. ............. | 362/249.02 |
| 8,342,716 | B2 * | 1/2013 | Lin ............................... | 362/294 |

(Continued)

FOREIGN PATENT DOCUMENTS

| | | | |
|---|---|---|---|
| JP | 2010165683 A | * | 7/2010 |
| TW | M323113 | | 12/2007 |

(Continued)

OTHER PUBLICATIONS

Machine English Translation of Takashige et al. (JP 2010-165683) Jul. 29, 2010.*

*Primary Examiner* — Anh Mai
*Assistant Examiner* — Glenn Zimmerman
(74) *Attorney, Agent, or Firm* — Moser Taboada

(57) ABSTRACT

An illumination apparatus includes a substrate, an illumination element and a lens structure. The illumination element is disposed on the substrate. The lens structure is disposed above the illumination element, and includes a lens body and a plurality of lens stands. The lens body is positioned above the illumination element. The lens stands are disposed on the bottom of the lens body. The substrate has a plurality of tunnels are around the illumination element. The lens stands respectively insert into the tunnels, so that the lens body is fastened on the substrate.

18 Claims, 8 Drawing Sheets

(56) References Cited

U.S. PATENT DOCUMENTS

| | | | |
|---|---|---|---|
| 8,562,184 B2 * | 10/2013 | Klipstein et al. | 362/373 |
| 2006/0076570 A1 * | 4/2006 | Chen et al. | 257/99 |
| 2006/0139918 A1 * | 6/2006 | Dolgin et al. | 362/232 |
| 2010/0157572 A1 * | 6/2010 | Wei et al. | 362/84 |
| 2010/0254135 A1 * | 10/2010 | Bayat et al. | 362/235 |
| 2010/0270922 A1 * | 10/2010 | Lin | 315/32 |
| 2011/0007493 A1 * | 1/2011 | Ishio et al. | 362/97.1 |
| 2011/0032707 A1 * | 2/2011 | Takashige et al. | 362/277 |
| 2011/0085336 A1 * | 4/2011 | Blumel et al. | 362/255 |
| 2011/0121341 A1 * | 5/2011 | Lee et al. | 257/98 |
| 2012/0081619 A1 | 4/2012 | Shimizu | |
| 2012/0087122 A1 * | 4/2012 | Takeuchi et al. | 362/235 |
| 2013/0044501 A1 * | 2/2013 | Rudisill et al. | 362/398 |
| 2013/0308320 A1 * | 11/2013 | Kawahara et al. | 362/311.09 |

FOREIGN PATENT DOCUMENTS

| | | |
|---|---|---|
| TW | I358579 | 2/2012 |
| TW | I360694 | 3/2013 |

\* cited by examiner

ILLUMINATION APPARATUS

RELATED APPLICATIONS

This application claims priority to Taiwan Application Serial Number 101140361, filed Oct. 31, 2012, which is herein incorporated by reference.

BACKGROUND

1. Technical Field

Embodiments of the present invention relate to an illumination apparatus. More particularly, embodiments of the present invention relate to an illumination apparatus with a lens structure.

2. Description of Related Art

The emission angle of a typical light emitting diode (LED) is constant, e.g., 120 degrees. To meet demands on optical characteristics of various illumination modules, a secondary optical lens is usually applied to cover the LED to modify the illumination distribution of the LED.

Generally, during the manufacturing process, the LED is mounted on the substrate by the surface mount technology (SMT), and then, the LED is fastened thereon during a first heat treatment process like a reflow process. After the LED is fastened, the secondary optical lens can be disposed on the substrate with glue and covers the LED. The glue can be cured by a second heat treatment process, such as a roasting process.

Because the LED requires solder to be fastened on the substrate, and the melting temperature of the solder is higher than the temperature of the second heat treatment of the secondary optical lens, the typical lens made of the plastic material tends to deform or deteriorate.

In view of the foregoing, the LED and the secondary optical lens currently cannot be formed within one single heat treatment process. It is inevitable that two heat treatment processes are required to mount the LED and the secondary optical lens on the substrate, which raises the manufacture cost and may influence the optical characteristic of the LED.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In accordance with one embodiment of the present invention, the illumination apparatus includes a substrate, an illumination element, and a lens structure. The illumination element is disposed on the substrate. The lens structure is disposed above the illumination element. The lens structure includes a lens body and a plurality of lens stands. The lens body is positioned above the illumination element. The lens stands are disposed on the bottom of the lens body. The substrate has a plurality of tunnels around the illumination element. The lens stands respectively insert into the tunnels, so that the lens body is fastened on the substrate.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
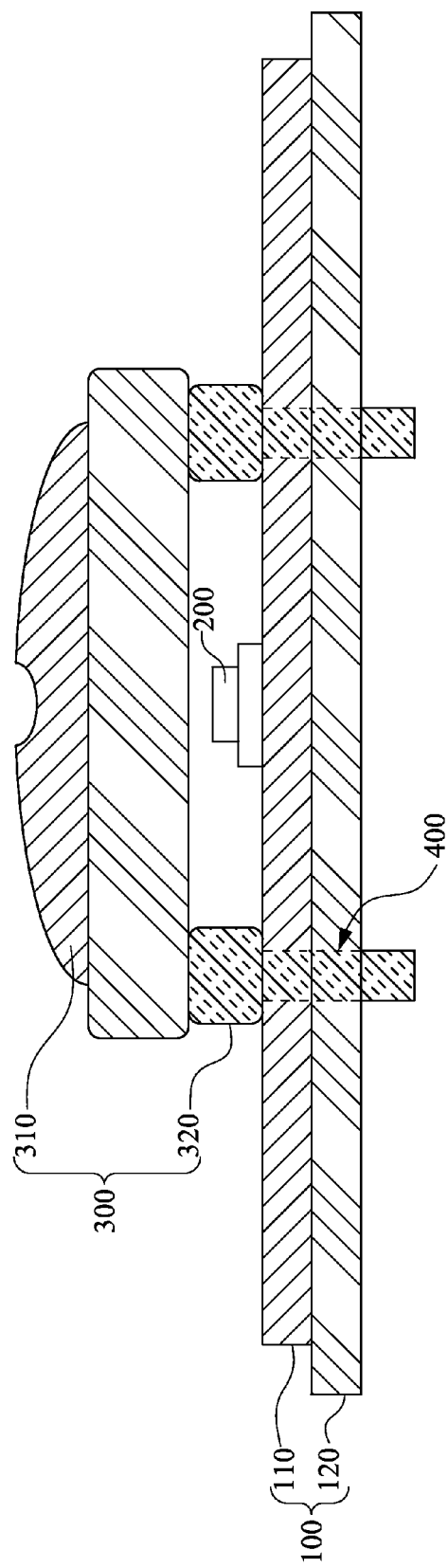
FIG. 1 is a cross-sectional view of an illumination apparatus in accordance with one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of an illumination apparatus in accordance with one embodiment of the present invention. As shown in FIG. 1, the illumination apparatus includes a substrate 100, an illumination element 200 and a lens structure 300. The illumination element 200 is disposed on the substrate 100. The lens structure 300 is disposed above the illumination element 200. The lens structure 300 includes a lens body 310 and a plurality of lens stands 320. The lens body 310 is positioned above the illumination element 200. The lens stands 320 are disposed on the bottom of the lens body 310. The substrate 100 has a plurality of tunnels 400 around the illumination element 200. The lens stands 320 respectively insert into the tunnels 400, so that the lens body 310 is fastened on the substrate 100.

Because the substrate 100 has tunnels 400 that can be inserted and threaded by the lens stands 320, the lens stands 320 can be fitted in the tunnels 400. Therefore, the positions of the lens stands 320 can be limited by the tunnels 400, so that the lens structure 300 can be fastened, and will not move freely. Moreover, because the lens structure 300 can be fastened by inserting the lens stands 320 into the tunnels 400, no adhesive glue is required, and therefore, the heat treatment process for curing the adhesive glue can be omitted. Accordingly, the manufacturing process of the illumination apparatus in accordance with the foregoing embodiment only requires one heat treatment process, so as to prevent from influencing the optical characteristics of the illumination element 200, and to reduce the manufacture cost.

Figure 2:
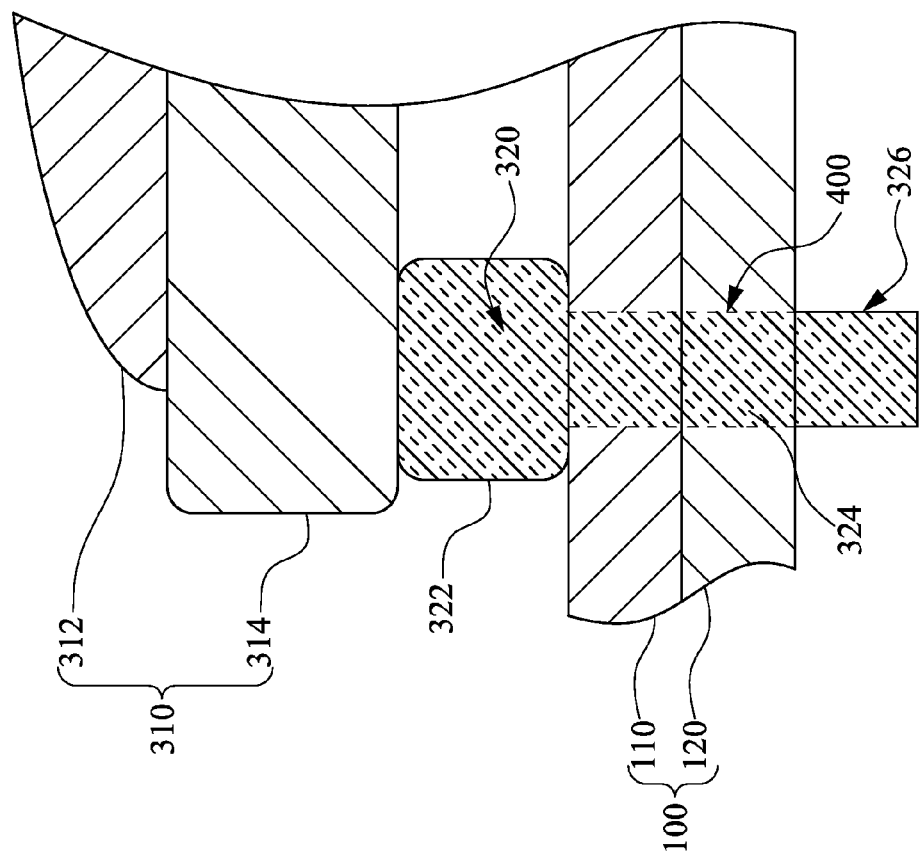
FIG. 2 is a fragmentary cross-sectional view of the illumination apparatus in FIG. 1.

FIG. 2 is a fragmentary cross-sectional view of the illumination apparatus in FIG. 1. As shown in FIG. 2, each of the lens stands 320 includes a supporting part 322 and a threading part 324. The supporting part 322 is positioned between the bottom of the lens body 310 and the substrate 100 for supporting the lens body 310. The threading part 324 is connected to the supporting part 322. The threading part 324 threads through the tunnel 400. The length of the threading part 324 is long enough to make the bottom 326 of the threading part 324 exposed out of the substrate 100.

In particular, the supporting part 322 is positioned on the substrate 100 and supports the lens body 310. The threading part 324 inserts into the tunnel 400, and the length of the threading part 324 is greater than the thickness of the substrate 100, so that the bottom 326 of the threading part 324 can be exposed out of the substrate 100. In some embodiments, the shape and the size of the threading part 324 is the same as which of the tunnel 400, so as to facilitate the threading part 324 to be steadily fastened in the tunnel 400.

In some embodiments, the cross-sectional area of the supporting part 322 is greater than the cross-sectional area of the threading part 324, and the cross-sectional area of the supporting part 322 is greater than the cross-sectional area of the tunnel 400. In other words, the cross-section of the threading part 324 and the cross-section of the tunnel 400 are both narrower than the cross-section of the supporting part 322. Therefore, when the threading part 324 threads through the tunnel 400, the supporting part 322 can be blocked on the substrate 100, rather than falling into the tunnel 400.

In some embodiments, the threading parts 324 are fitted to the tunnels 400. In particular, the cross-sectional area of the threading part 324 can be equal to the cross-sectional area of the tunnel 400, so that the threading part 324 can be fitted to the tunnel 400, thereby improving the stability of the lens structure 300 on the substrate 100. In some embodiments, the fitness between the threading part 324 and the tunnel 400 reaches the water-tight or air-tight level, so as to prevent external objects, such as water or dusts, from falling into the space between the lens structure 300 and the substrate 100.

In some embodiments, the thickness of the supporting part 322 is greater than the thickness of the illumination element 200 (FIG. 1), so as to prevent the lens body 310 from contacting or pressing the illumination element 200 (FIG. 1).

As shown in FIG. 2, the lens body 310 includes a lens crown 312 and a lens circumference 314. The lens circumference 314 is disposed on the supporting part 322 and is thereby supported by the supporting part 322. The lens crown 312 is disposed on the lens circumference 314 and is positioned on the optical path of the light emitted by the illumination element 200 (FIG. 1). In other words, the lens crown 312 is positioned above the illumination element 200 (FIG. 1), and it can modify the illumination distribution of the light emitted by the illumination element 200 (FIG. 1). The surface of the lens crown 312 is, but is not limited to be, arc-shaped, curve-shaped or in other geometric-shaped. The lens body 310 is formed by the light transmissive material, so that the light emitted by the illumination element 200 (FIG. 1) can propagate through the lens body 310.

Figure 3:
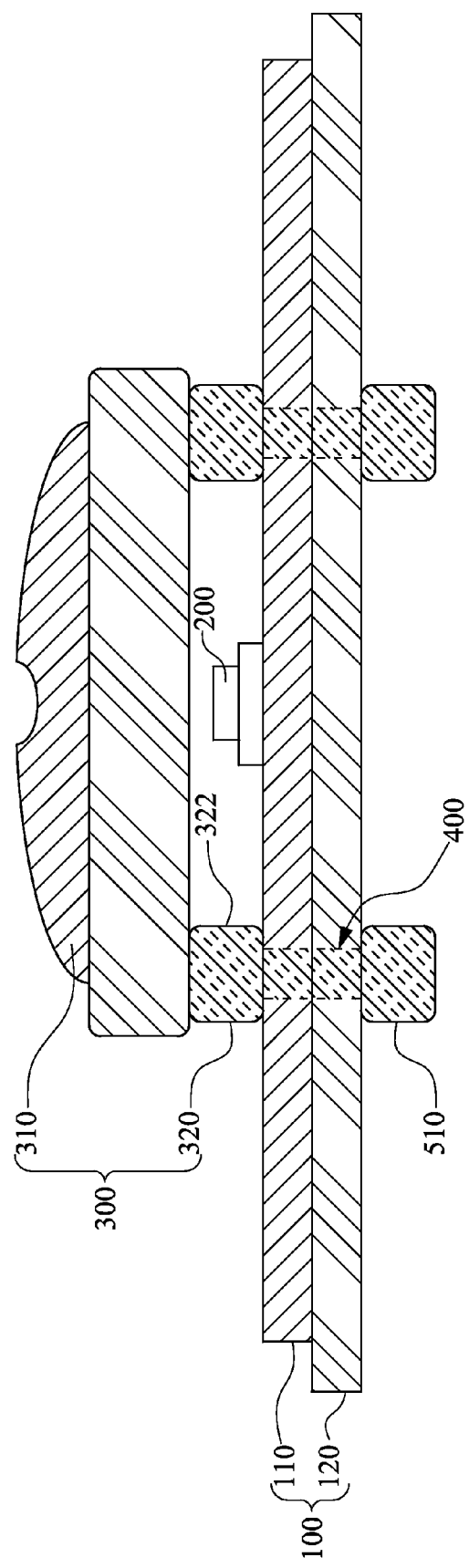
FIG. 3 is a cross-sectional view of the illumination apparatus in accordance with another embodiment of the present invention.

FIG. 3 is a cross-sectional view of the illumination apparatus in accordance with another embodiment of the present invention. The main difference between this embodiment and FIG. 1 is that: a plurality of fasteners 510 is included. Each of the fasteners 510 respectively enfolds the exposed bottom 326 (FIG. 2) of the lens stand 320. The fastener 510 presses against the bottom surface of the substrate 100, and this bottom surface is a surface of the substrate 100 opposite to the illumination element 200.

When the lens stands 320 bear upward force, the fasteners 510 can press against the bottom of the substrate 100, so as to prevent the lens stands 320 from moving upwardly and out of the tunnel 400. Further, the substrate 100 can be clipped between the fasteners 510 and the supporting parts 322 of the lens stands 320. Therefore, when the substrate 100 is formed by overlapping a plurality of plates, the supporting parts 322 of the lens stands 320 and the fasteners 510 can fasten the space relations among the plates of the plate 100.

For example, the substrate 100 includes a circuit board 110 and a back plate 120 overlapping with the circuit board 110. The tunnel 400 connects the circuit board 110 and the back plate 120. The supporting part 322 is positioned on the circuit board 110, and the fastener 510 is position beneath the back plate 120 and presses against the back plate 120. Therefore, the circuit board 110 and the back plate 120 can be clipped between the supporting part 322 and the fastener 510. In other words, the supporting part 322 and the fastener 510 can fasten the circuit board 110 on the back plate 120. In some embodiments, the substrate 100 can also only include the circuit board 110, and the lens stands 320 are fastened on the circuit board 110.

In this embodiment, the cross-sectional area of the supporting part 322 and the cross-sectional area of the fastener 510 are both greater than the cross-sectional area of the tunnel 400, so that the supporting part 322 and the fastener 510 can clip the circuit board 110 and the back plate 120.

In this embodiment, at least one of the fasteners 510 is a screw nut, and it can be screwed on the lens stand 320. The process for assembling the fastener 510 (being the screw nut herein) and the lens stand 320 is shown as in FIGS. 4A-4C. It is understood that in order to clearly exhibit the process for assembling the fastener 510 (being the screw nut herein) and the lens stand 320, the lens body 310 and the illumination element 200 are not shown in FIGS. 4A-4C.

Figure 4:
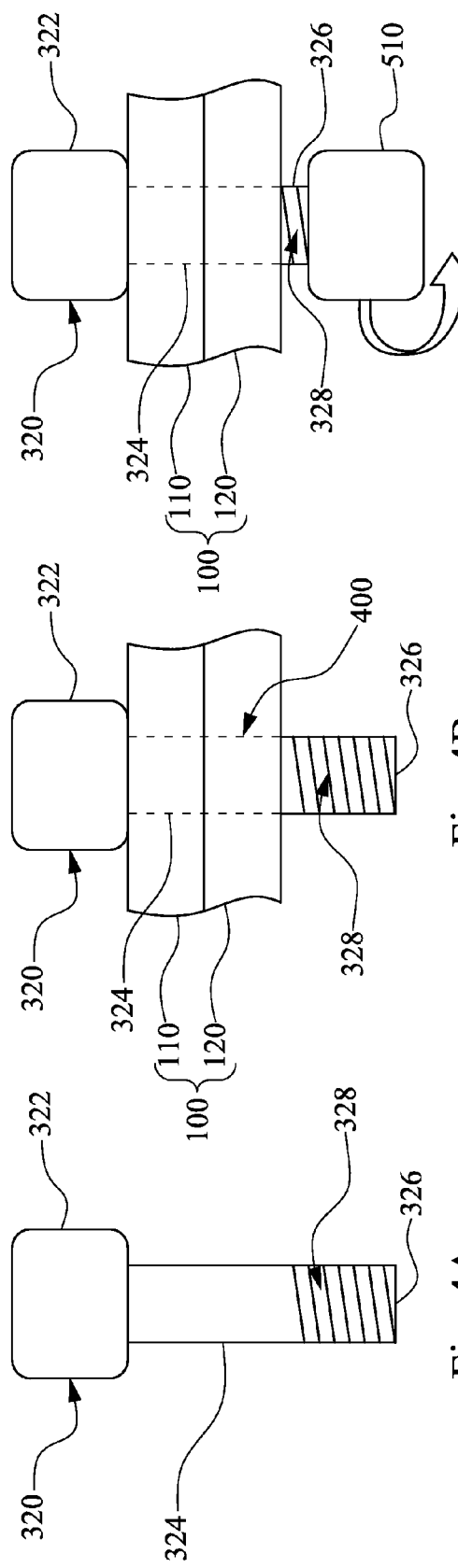
FIGS. 4A-4C is a side view illustrating the process for assembling the fastener and the lens stand in accordance with one embodiment of the present invention.

As shown in FIG. 4A, the manufacturer can provide the lens stand 320. The lens stand 320 includes the supporting part 322 and the threading part 324. At least one lens stand 320 includes a screw thread 328. The screw thread 328 is positioned on the bottom 326 of the threading part 324, and the fastener 510 (FIG. 3) can be screwed on the bottom 326 of the threading part 324 by the screw thread 328.

As shown in FIG. 4B, the manufacturer can insert the threading part 324 into the tunnel 400, and the bottom 326 of the threading part 324 can thread through the tunnel 400 and is exposed out of the back plate 120. The screw thread 328 can also be exposed out of the back plate 120. The supporting part 322 presses on the circuit board 110.

As shown in FIG. 4C, when the bottom 326 of the threading part 324 and the crew thread 328 are exposed out of the back plate 120, the manufacturer can screw the fastener 510 (being the screw nut herein) on the bottom 326 of the threading part 324 by the screw thread 328, and the fastener 510 can presses against the back plate 120. In this embodiment, the fastener 510 includes the screw thread corresponding to the screw thread 328 on the bottom 326, so that the fastener 510 can be screwed on the bottom 326 of the threading part 324.

Figure 5:
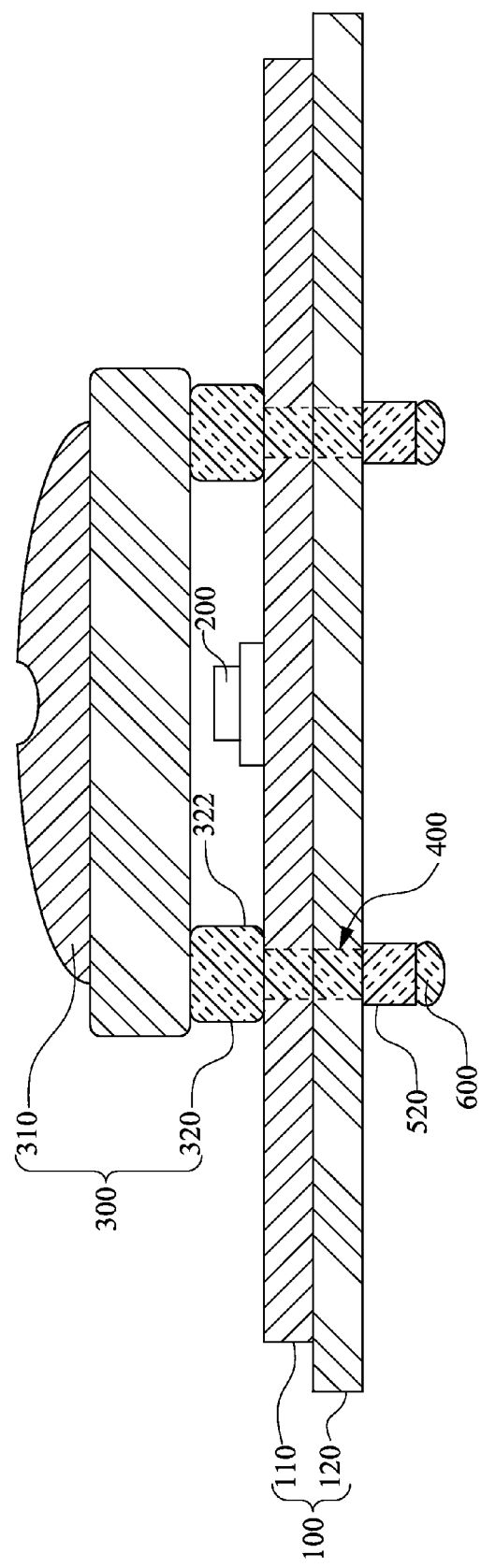
FIG. 5 is a cross-sectional view of the illumination apparatus in accordance with yet another embodiment of the present invention.

FIG. 5 is a cross-sectional view of the illumination apparatus in accordance with yet another embodiment of the present invention. The main difference between this embodiment and FIG. 3 is that: at least one of the fasteners 520 is an elastic ring. At least one of the lens stands 320 includes a protrusion part 600 on the bottom of the threading part. The fastener 520 (being the elastic ring herein) is clipped between the substrate 100 and the protrusion part 600.

When the lens stands 320 bear upward force, the fasteners 520 can press against the bottom of the substrate 100, so as to prevent the lens stands 320 from moving upwardly and out of the tunnel 400. Further, the supporting part 322 is positioned on the circuit board 110, and the fastener 520 is positioned beneath the back plate 120 and presses against the back plate 120. Therefore, the circuit board 110 and the back plate 120 can be clipped between the fasteners 520 and the supporting parts 322 of the lens stands 320. In other words, the supporting parts 322 and the fasteners 520 can fasten the circuit board 110 on the back plate 120.

In this embodiment, the cross-sectional area of the supporting part 322 and the cross-sectional area of the fastener 520 are both greater than the cross-sectional area of the tunnel 400, so that the supporting part 322 and the fastener 520 can clip the circuit board 110 and the back plate 120.

Figure 6:
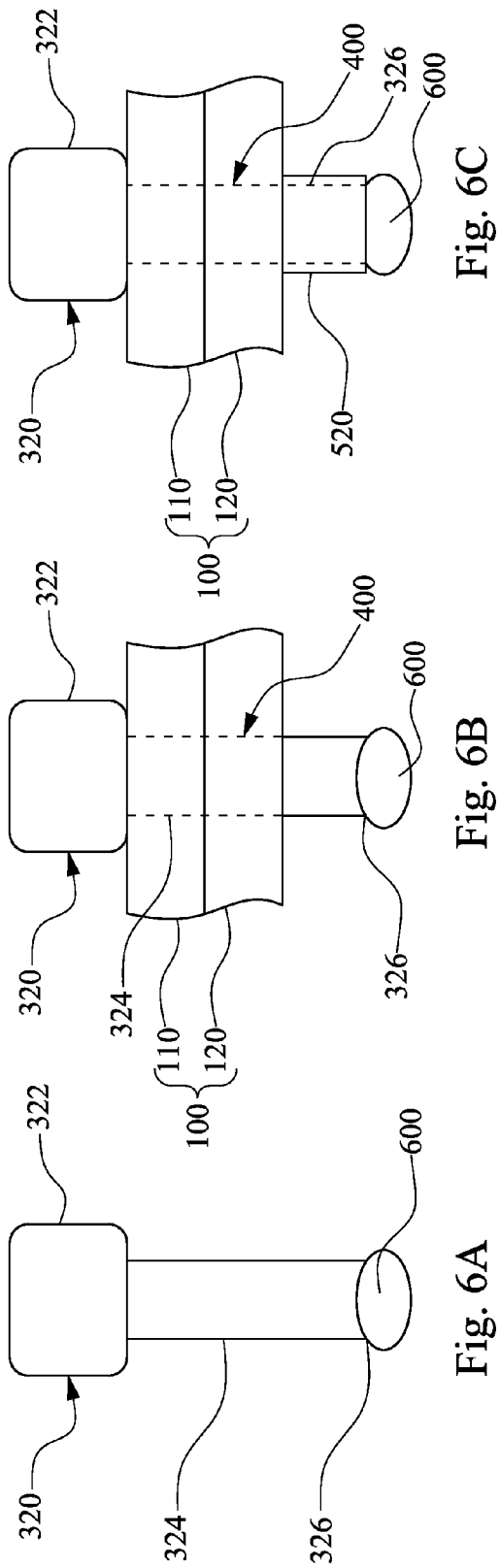
FIGS. 6A-6C is a side view illustrating the process for assembling the fastener and the lens stand in accordance with another embodiment of the present invention.

The process for assembling the fastener 520 (being the elastic ring herein) and the lens stand 320 is shown as in FIGS. 6A-6C. It is understood that in order to clearly exhibit the process for assembling the fastener 520 (being the elastic ring herein) and the lens stand 320, the lens body 310 and the illumination element 200 are not shown in FIGS. 6A-6C.

As shown in FIG. 6A, the manufacturer can provide the lens stand 320. The lens stand 320 includes the supporting part 322 and the threading part 324. At least one lens stand 320 includes the protrusion part 600. The protrusion part 600 is positioned on the bottom 326 of the threading part 324. In particular, the cross-sectional area of the protrusion part 600 is greater than the cross-sectional area of the threading part 324, so as to press against the fastener 520 (FIG. 5). In some embodiments, the protrusion part 600 is a protruded sphere.

As shown in FIG. 6B, the manufacturer can insert the threading part 324 into the tunnel 400, and the protrusion part 600 can thread through the tunnel 400 and be exposed out of the back plate 120. The protrusion part 600 is preferably formed by elastic material, so as to facilitate the protrusion part 600 to thread through the tunnel 400. In particular, the protrusion part 600 can be pressed by the inner wall of the tunnel 400 and slightly shrinks when it is in the tunnel 400. When the protrusion part 600 threads through the tunnel 400, it can be reinstated to the original shape and size due to the elastic ability thereof.

As shown in FIG. 6C, when the protrusion part 600 threads through the tunnel 400 and is exposed out of the back plate 120, the manufacturer can slightly pull the fastener 520 (being the elastic ring herein) outwardly, and can make the fastener 520 cross the protrusion part 600. When the fastener 520 crosses the protrusion part 600, the manufacturer can release the fastener 520, so that the fastener 520 can be reinstated to the original shape and size due to the elastic ability thereof, and can enfold the bottom 326 of the threading part 324 and be clipped between the substrate 100 and the protrusion part 600. In this embodiment, the fastener 520 is a ring-shaped structure preferably formed by elastic material, such as rubber.

In some embodiments, the lens body 310, the lens stands 320 and the protrusion parts 600 can be formed by a single process of injection molding, and therefore, their material are all the same. In some embodiments, the lens body 310, the lens stands 320 and the protrusion parts 600 can be formed by transparent material via the injection molding, so that the light can propagate through the lens body 310. When the transparent material with lower elastic modulus is employed, the diameter of the tunnel 400 is preferably greater than the diameter of the protrusion part 600, so as to facilitate the protrusion part 600 to thread through the tunnel 400.

Figure 7:
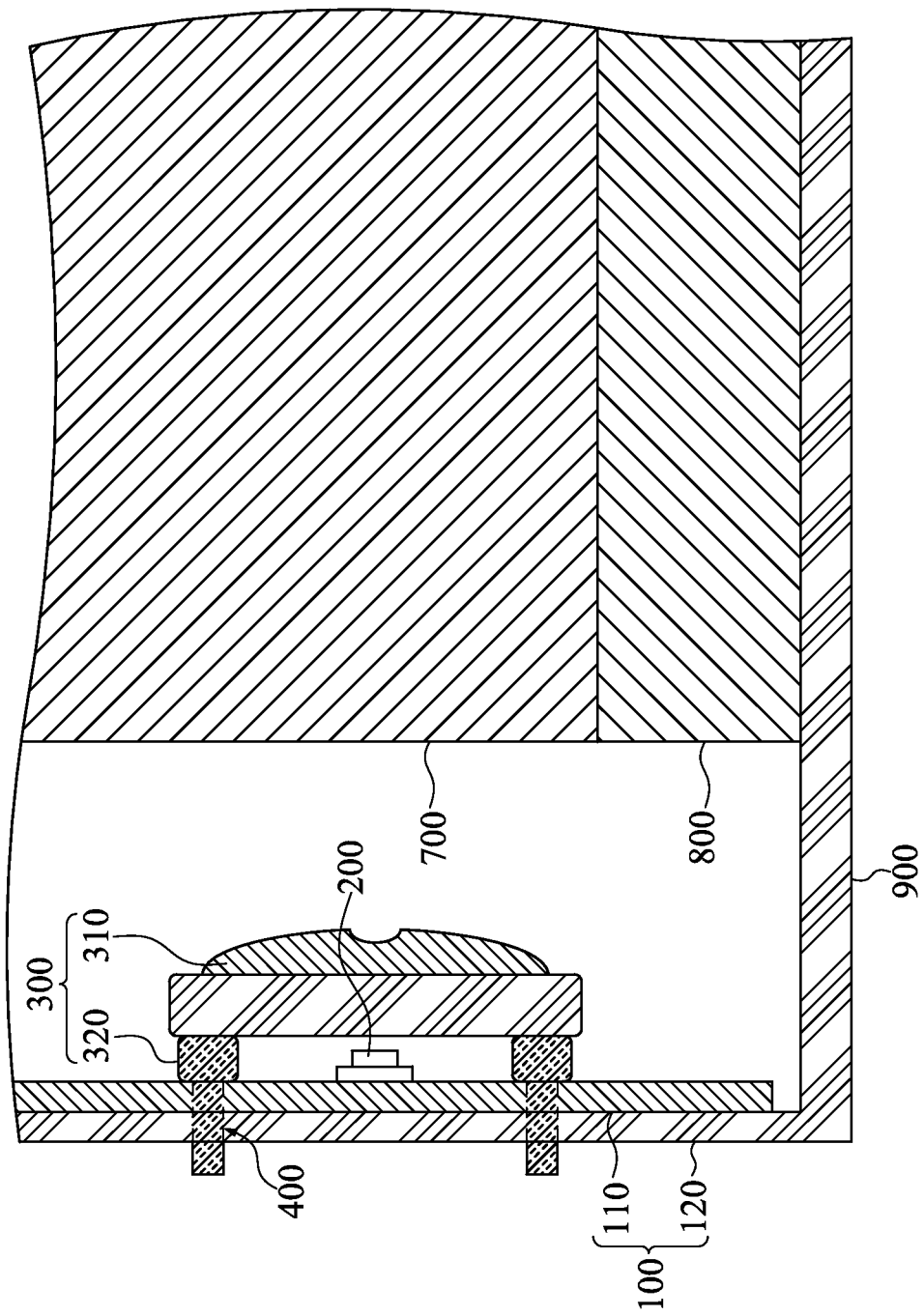
FIG. 7 is a fragmentary cross-sectional view of the edge-lit backlight module employing the illumination apparatus in accordance with one embodiment of the present invention.

FIG. 7 is a fragmentary cross-sectional view of the edge-lit backlight module employing the illumination apparatus in accordance with one embodiment of the present invention. As shown in FIG. 7, the back plate 120 can be a cover of a display. The back plate 120 can be adjacent to a bottom plate 900. The bottom plate 900 can be another cover of the display. The back plate 120 and the bottom plate 900 can form the frame of the display. A reflective sheet 800 is disposed on the bottom plate 900. A light guide plate 700 is disposed on the reflective sheet 800. The back plate 120 can be substantially vertically adjacent to the bottom plate 900. Therefore, the illumination element 200 can emit light into the light guide plate 700 in the edge-lit manner. It is understood that the illumination apparatus in FIG. 1 is employed herein, and nevertheless, the backlight module can also employ the illumination apparatus in FIG. 3 or FIG. 5.

Figure 8:
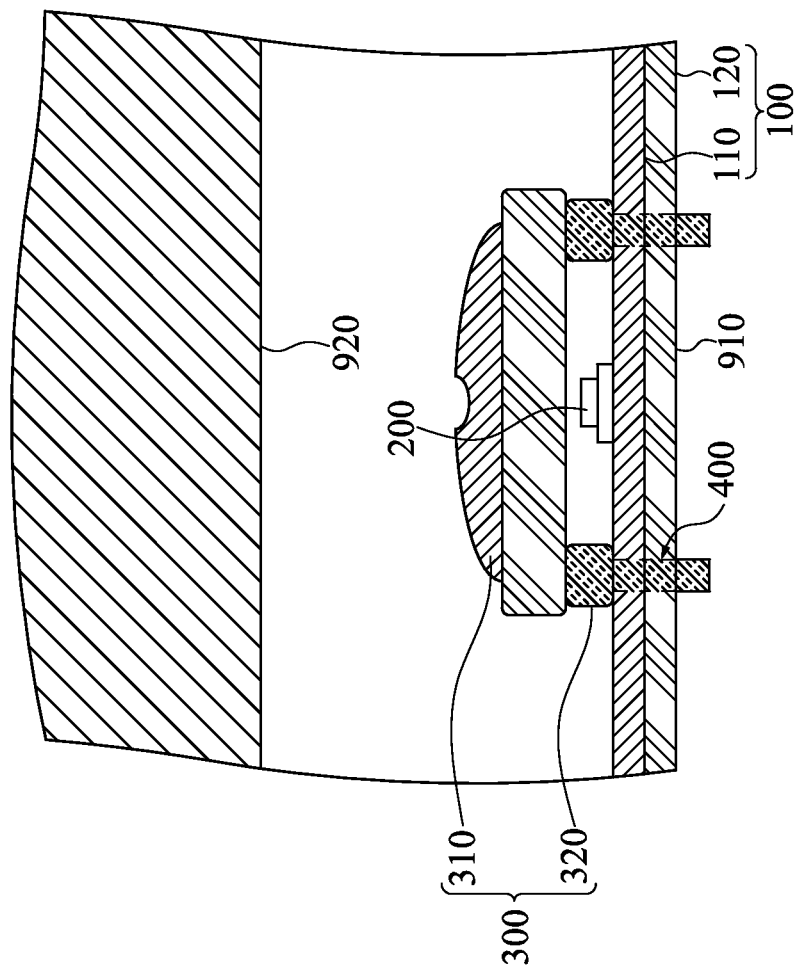
FIG. 8 is a fragmentary cross-sectional view of the direct-lit backlight module employing the illumination apparatus in accordance with one embodiment of the present invention.

FIG. 8 is a fragmentary cross-sectional view of the direct-lit backlight module employing the illumination apparatus in accordance with one embodiment of the present invention. The main difference between this embodiment and FIG. 7 is that: the illumination apparatus is disposed on a back cover 910 of the display. In other words, the back cover 910 of the display is the back plate 120 of the illumination apparatus. The circuit board 110 of the illumination apparatus is disposed on the back cover 910 of the display. The display element layer 920 is positioned above the lens structure 300. Therefore, the illumination apparatus can directly emit the light into the display element layer 920 without the light guide plate 700 and the reflective sheet 800, thereby implementing the direct-lit backlight module. The display element layer 920 includes, but is not limited to include, a liquid crystal layer, a polarizer film or a diffuser film.

In some embodiments, the illumination element 200 can be a LED (light emitting diode). For example, the illumination element 200 can be, but is not limited to be, a LED package or a LED chip. In some embodiments, the illumination element 200 can be, but is not limited to be, a white LED, a red LED, a green LED or a blue LED.

It will be understood that when an element is referred to as being "on" another element, it can be directly on the other element or intervening elements may be present therebetween. For example, the description "the illumination element 200 is disposed in the substrate 100" not only includes the embodiment in which the illumination element 200 is in direct contact with the substrate 100, but also includes the embodiment in which intervening elements, such as the thermal conductive glue, are positioned between the illumination element 200 and the substrate 100.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An illumination apparatus, comprising:
 a substrate having a top surface;
 an illumination element disposed on the top surface of the substrate; and
 a lens structure disposed above the illumination element, the lens structure comprising:
 a lens body positioned above the illumination element and having a bottom surface; and
 a plurality of lens stands disposed on the bottom surface of the lens body,
 wherein the substrate has a plurality of tunnels around the illumination element, wherein the lens stands respectively insert into the tunnels, so that the lens body is fastened on the substrate;
 wherein each of the lens stands comprises:

a supporting part supporting the lens body; and a threading part connected to the supporting part and threading through the tunnel, wherein the length of the threading part is long enough to make the bottom of the threading part exposed out of the substrate, wherein the cross-sectional area of the supporting part taken along a direction parallel to the top surface of the substrate is greater than the cross-sectional area of the threading part taken along the direction parallel to the top surface of the substrate.

2. The illumination apparatus of claim 1, further comprising a plurality of fasteners, wherein each of the fasteners respectively enfolds the exposed bottom of the threading part of each of the lens stands.

3. The illumination apparatus of claim 2, wherein at least one of the fasteners is a screw nut, and at least one of the threading parts includes a screw thread on the bottom thereof, wherein the screw nut is screwed on the bottom of the threading part.

4. The illumination apparatus of claim 2, wherein at least one of the fasteners is an elastic ring, and at least one of the threading parts includes a protrusion part on the bottom thereof, wherein the elastic ring is clipped between the substrate and the protrusion part.

5. The illumination apparatus of claim 1, wherein the threading part is fitted to the tunnel.

6. The illumination apparatus of claim 1, wherein the cross-sectional area of the supporting part taken along the direction parallel to the top surface of the substrate is greater than the cross-sectional area of the tunnel taken along the direction parallel to the top surface of the substrate.

7. The illumination apparatus of claim 1, wherein thickness of the supporting part is greater than thickness of the illumination element.

8. The illumination apparatus of claim 1, wherein the substrate comprises a circuit board.

9. The illumination apparatus of claim 8, wherein the substrate comprises a back plate.

10. The illumination apparatus of claim 9, wherein the back plate is a cover of a display.

11. The illumination apparatus of claim 10, wherein the material of the back plate is metal.

12. An illumination apparatus, comprising:
a substrate;
an illumination element disposed on the substrate; and
a lens structure disposed above the illumination element, the lens structure comprising:
a lens body positioned above the illumination element;
a plurality of lens stands disposed on the bottom of the lens body; and
a plurality of fasteners;
wherein the substrate has a plurality of tunnels around the illumination element, wherein the lens stands respectively insert into the tunnels, so that the lens body is fastened on the substrate;
wherein each of the lens stands comprises:
a supporting part supporting the lens body; and
a threading part connected to the supporting part and threading through the tunnel;
wherein the length of the threading part is long enough to make the bottom of the threading part exposed out of the substrate, wherein each of the fasteners respectively enfolds the exposed bottom of the threading part of each of the lens stands, wherein at least one of the fasteners is an elastic ring, and at least one of the threading parts comprises a protrusion part on the bottom thereof, wherein the elastic ring is clipped between the substrate and the protrusion part.

13. The illumination apparatus of claim 12, wherein the cross-sectional area of the supporting part taken along a direction parallel to a top surface of the substrate is greater than the cross-sectional area of the threading part taken along the direction parallel to the top surface of the substrate.

14. The illumination apparatus of claim 13, wherein the threading part is fitted to the tunnel.

15. The illumination apparatus of claim 13, wherein the cross-sectional area of the supporting part taken along the direction parallel to the top surface of the substrate is greater than the cross-sectional area of the tunnel taken along the direction parallel to the top surface of the substrate.

16. The illumination apparatus of claim 12, wherein thickness of the supporting part is greater than thickness of the illumination element.

17. The illumination apparatus of claim 12, wherein the substrate comprises a circuit board.

18. The illumination apparatus of claim 17, wherein the substrate comprises a back plate which is a cover of a display.

* * * * *